United States Patent
Mong et al.

(10) Patent No.: US 9,397,016 B2
(45) Date of Patent: *Jul. 19, 2016

(54) FLIP CHIP ASSEMBLY PROCESS FOR ULTRA THIN SUBSTRATE AND PACKAGE ON PACKAGE ASSEMBLY

(71) Applicant: Intel Corporation, Santa Clara, CA (US)

(72) Inventors: Weng Khoon Mong, Penang (MY); A. Vethanayagam Rudge, Penang (MY); Bok Sim Lim, Penang (MY); Mun Leong Loke, Biekit Mertajam (MY); Kang Eu Ong, Penang (MY); Sih Fei Lim, Bukit Mertajasu (MY); Tean Wee Ong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/500,557

(22) Filed: Sep. 29, 2014

(65) Prior Publication Data

US 2015/0076692 A1    Mar. 19, 2015

Related U.S. Application Data

(60) Continuation of application No. 13/600,547, filed on Aug. 31, 2012, now Pat. No. 8,847,368, which is a division of application No. 12/164,404, filed on Jun. 30, 2008, now Pat. No. 8,258,019.

(51) Int. Cl.
*H01L 23/48* (2006.01)
*H01L 23/12* (2006.01)
(Continued)

(52) U.S. Cl.
CPC ............ *H01L 23/12* (2013.01); *H01L 23/3157* (2013.01); *H01L 23/49816* (2013.01);
(Continued)

(58) Field of Classification Search
CPC ...... H01L 21/56; H01L 21/565; H01L 21/563
USPC ........... 257/667, 668, 690, 701, 738; 438/464
See application file for complete search history.

(56) References Cited

U.S. PATENT DOCUMENTS

| 6,100,114 A * | 8/2000 | Milkovich et al. |
| 6,404,062 B1 * | 6/2002 | Taniguchi et al. ............ 257/778 |

(Continued)

FOREIGN PATENT DOCUMENTS

| CN | 1956183 A | 5/2007 |
| CN | 101981680 A | 2/2011 |

(Continued)

OTHER PUBLICATIONS

"Application U.S. Appl. No. 12/164,404, Non Final Office Action mailed 05-20-10", 9 pgs.

(Continued)

*Primary Examiner* — Nicholas Tobergte
(74) *Attorney, Agent, or Firm* — Schwegman Lundberg & Woessner, P.A.

(57) ABSTRACT

In some embodiments, selective electroless plating for electronic substrates is presented. In this regard, a method is introduced including receiving a coreless substrate strip, attaching solder balls to a backside of the coreless substrate strip, and forming a backside stiffening mold amongst the solder balls. Other embodiments are also disclosed and claimed.

18 Claims, 2 Drawing Sheets

(51) Int. Cl.
  *H01L 23/498* (2006.01)
  *H01L 23/00* (2006.01)
  *H01L 25/10* (2006.01)
  *H01L 25/00* (2006.01)
  *H01L 23/50* (2006.01)
  *H01L 23/31* (2006.01)

(52) U.S. Cl.
  CPC .............. *H01L23/50* (2013.01); *H01L 23/562* (2013.01); *H01L 24/17* (2013.01); *H01L 25/105* (2013.01); *H01L 25/50* (2013.01); *H01L 23/3128* (2013.01); *H01L 24/16* (2013.01); *H01L 2224/16225* (2013.01); *H01L 2224/32225* (2013.01); *H01L 2224/73204* (2013.01); *H01L 2225/1023* (2013.01); *H01L 2225/1058* (2013.01); *H01L 2924/12042* (2013.01); *H01L 2924/14* (2013.01); *H01L 2924/15165* (2013.01); *H01L 2924/15311* (2013.01); *H01L 2924/15331* (2013.01); *H01L 2924/181* (2013.01); *H01L 2924/3511* (2013.01)

(56) References Cited

U.S. PATENT DOCUMENTS

| | | |
|---|---|---|
| 6,650,022 B1 | 11/2003 | Danvir et al. |
| 6,713,366 B2 | 3/2004 | Mong et al. |
| 7,005,317 B2 | 2/2006 | Chin et al. |
| 7,071,576 B2 | 7/2006 | Nakayoshi et al. |
| 7,172,951 B2 | 2/2007 | Chin et al. |
| 8,258,019 B2 | 9/2012 | Mong et al. |
| 2002/0024137 A1 | 2/2002 | Olofsson et al. |
| 2002/0068453 A1* | 6/2002 | Grigg et al. ................... 438/690 |
| 2003/0011077 A1 | 1/2003 | Morishima et al. |
| 2003/0136576 A1 | 7/2003 | Joly |
| 2007/0096292 A1 | 5/2007 | Machida |
| 2009/0321928 A1 | 12/2009 | Mong et al. |
| 2009/0321949 A1 | 12/2009 | Sim et al. |
| 2012/0319276 A1 | 12/2012 | Mong et al. |

FOREIGN PATENT DOCUMENTS

| | | | |
|---|---|---|---|
| JP | 2000357714 A | | 12/2000 |
| KR | 20020001426 A | | 1/2002 |
| SG | 192460 A | | 8/2013 |
| TW | 1274406 B | | 2/2007 |
| TW | 1409890 B1 | | 9/2013 |
| WO | WO-2010002739 A2 | | 1/2010 |
| WO | WO-2010002739 A3 | | 1/2010 |

OTHER PUBLICATIONS

"Application U.S. Appl. No. 12/164,404, Non Final Office Action mailed 12-03-10", 8 pgs.
"Application U.S. Appl. No. 12/164,404, Notice of Allowance mailed 07-27-11", 8 pgs.
"Application U.S. Appl. No. 12/164,404, Notice of Allowance mailed 09-02-11", 7 pgs.
"Application U.S. Appl. No. 12/164,404, Notice of Allowance mailed 12-15-11", 8 pgs.
"Application U.S. Appl. No. 12/164,404, Response filed 05-03-10 to Restriction Requirement mailed 04-01-10", 7 pgs.
"Application U.S. Appl. No. 12/164,404, Response filed 05-09-11 to Non Final Office Action mailed 03-08-11", 8 pgs.
"Application U.S. Appl. No. 12/164,404, Response filed 09-20-10 to Non Final Office Action mailed 05-20-10", 7 pgs.
"Application U.S. Appl. No. 12/164,404, Restriction Requirement mailed 04-01-10", 7 pgs.
"Application U.S. Appl. No. 13/600,547, Final Office Action mailed 07-03-13", 12 pgs.
"Application U.S. Appl. No. 13/600,547, Non Final Office Action mailed 02-12-13", 13 pgs.
"Application U.S. Appl. No. 13/600,547, Non Final Office Action mailed 11-15-13", 9 pgs.
"Application U.S. Appl. No. 13/600,547, Notice of Allowance mailed 04-15-14", 7 pgs.
"Application U.S. Appl. No. 13/600,547, Response filed 02-18-14 to Non Final Office Action mailed 11-15-13", 6 pgs.
"Application U.S. Appl. No. 13/600,547, Response filed 05-13-13 to Non Final Office Action mailed 02-12-13", 14 pgs.
"Application U.S. Appl. No. 13/600,547, Response filed 05-13-13 to Non Final Office Action mailed 02-12-13", 7 pgs.
"Application U.S. Appl. No. 13/600,547, Response filed 11-04-13 to Final Office Action mailed 07-03-13", 6 pgs.
"Chinese Application U.S. Appl. No. 200980110789.3 Office Action mailed 08-08-11", 13 pgs.
"Chinese Application U.S. Appl. No. 200980110789.3, Decision on Rejection mailed 07-03-12", 10 pgs.
"Chinese Application U.S. Appl. No. 200980110789.3, Office Action mailed 03-14-12", With English Translation, 8 pgs.
"Chinese Application U.S. Appl. No. 200980110789.3, Response filed 10-18-12 to Office Action mailed 7-3-12", 6 pgs.
"Chinese Application U.S. Appl. No. 200980110789.3, Response filed 5-29-12 to Office Action mailed 3-14-12", 6 pgs.
"International Application U.S. Appl. No. PCT/US2009/048921, International Preliminary Report on Patentability mailed 01-05-11", 5 pgs.
"International Application U.S. Appl. No. PCT/US2009/048921, International Search Report mailed 02-04-10", 3 pgs.
"International Application U.S. Appl. No. PCT/US2009/048921, Written Opinion mailed Feb. 0410", 4 pgs.
"Korean Application U.S. Appl. No. Oct. 2010-7021159, Office Action Mailed Feb. 17, 2012", 6 Pgs.
"Korean Application U.S. Appl. No. Oct. 2010-7021159, Office Action Response Filed Jun. 18, 2012", 15 Pgs.
"Taiwan Application U.S. Appl. No. 098121840, Office Action mailed 09-26-12", w/English Translation, 19 pgs.
"Taiwanese Application U.S. Appl. No. 98121840, Response filed 03-21-13 to Office Action mailed 09-26-12", 5 pgs.

\* cited by examiner

US 9,397,016 B2

FLIP CHIP ASSEMBLY PROCESS FOR ULTRA THIN SUBSTRATE AND PACKAGE ON PACKAGE ASSEMBLY

PRIORITY APPLICATION

This application is a continuation of U.S. application Ser. No. 13/600,547, filed Aug. 31, 2012, which is a divisional of U.S. application Ser. No. 12/164,404, filed Jun. 30, 2008, now issued as U.S. Pat. No. 8,258,019, all of which are incorporated herein by reference in their entirety.

FIELD OF THE INVENTION

Embodiments of the present invention generally relate to the field of integrated circuit packages, and, more particularly to flip chip assembly process for ultra thin substrate and package on package assembly.

BACKGROUND OF THE INVENTION

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores).

Disadvantageously, with a thin or no-core substrate, however, decrease in yield at first level chip attach due to warpage causing nonwets may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
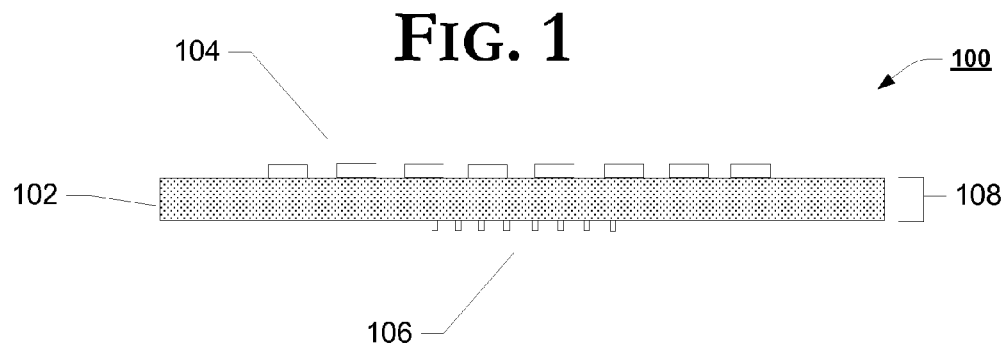
FIG. 1 is a graphical illustration of a cross-sectional view of a partially formed IC package, in accordance with one example embodiment of the invention.

FIG. 1 is a graphical illustration of a cross-sectional view of a partially formed IC package, in accordance with one example embodiment of the invention. In accordance with the illustrated example embodiment, package 100 includes one or more of coreless substrate strip 102, backside contacts 104, topside contacts 106 and substrate thickness 108.

Coreless substrate strip 102 represents a thin substrate that may be rolled out and processed before being singulated. In one embodiment, coreless substrate strip 102 is a direct laser lamination generation 3 (DLL3) strip. In one embodiment, substrate thickness 108 is about 200 micrometers.

Figure 2:
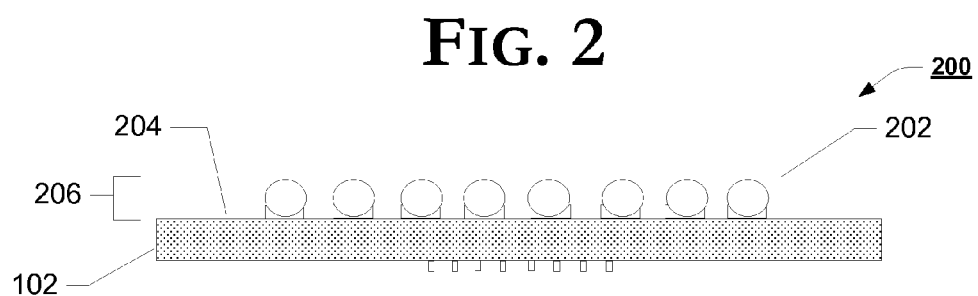
FIG. 2 is a graphical illustration of a cross-sectional view of a partially formed IC package, in accordance with one example embodiment of the invention.

FIG. 2 is a graphical illustration of a cross-sectional view of a partially formed IC package, in accordance with one example embodiment of the invention. As shown in package 200, solder balls 202 have been attached to backside 204 of coreless substrate strip 102. In one embodiment, solder ball diameter 206 is about 10 mils.

Figure 3:
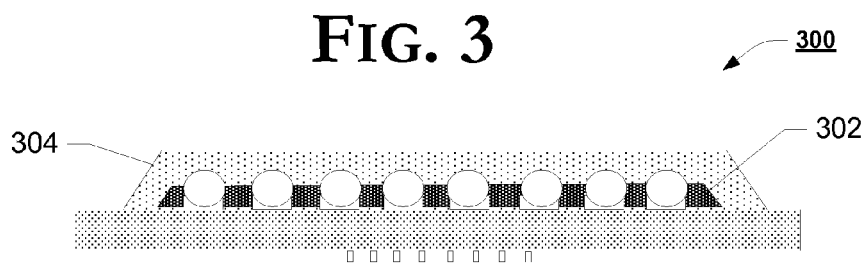
FIG. 3 is a graphical illustration of a cross-sectional view of a partially formed IC package, in accordance with one example embodiment of the invention.

FIG. 3 is a graphical illustration of a cross-sectional view of a partially formed IC package, in accordance with one example embodiment of the invention. As shown in package 300, mold compound 302 is dispensed as a liquid amongst the solder balls and compressed by mold form 304. In one embodiment, mold form 304 is designed to compress mold compound 302 below the height of the solder balls. Mold form 304 may be held in place for some time and may be heated to allow mold compound 302 to cure.

Figure 4:
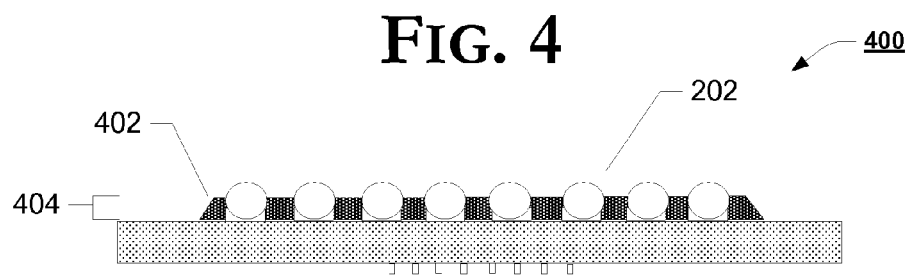
FIG. 4 is a graphical illustration of a cross-sectional view of a partially formed IC package, in accordance with one example embodiment of the invention.

FIG. 4 is a graphical illustration of a cross-sectional view of a partially formed IC package, in accordance with one example embodiment of the invention. As shown in package 400, stiffening mold 402 is cured amongst solder balls 202 and provides added stiffness to package 400. In one embodiment, stiffening mold 402 has a mold thickness 404 of about 200 micrometers.

Figure 5:
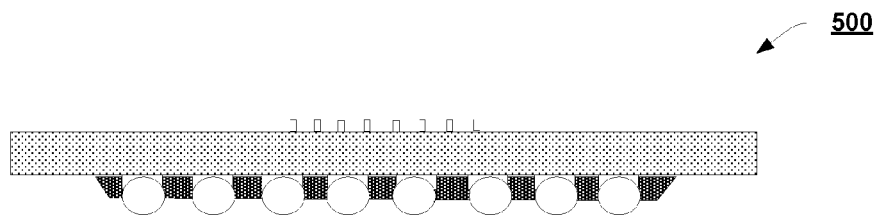
FIG. 5 is a graphical illustration of a cross-sectional view of a partially formed IC package, in accordance with one example embodiment of the invention.

FIG. 5 is a graphical illustration of a cross-sectional view of a partially formed IC package, in accordance with one example embodiment of the invention. As shown in package 500, the package has been flipped over for topside processing.

Figure 6:
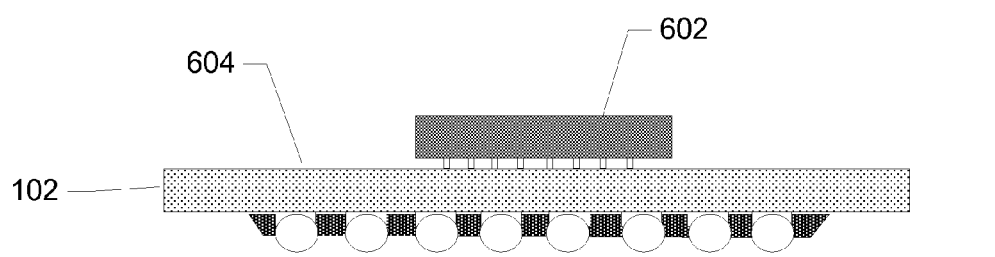
FIG. 6 is a graphical illustration of a cross-sectional view of a partially formed IC package, in accordance with one example embodiment of the invention.

FIG. 6 is a graphical illustration of a cross-sectional view of a partially formed IC package, in accordance with one example embodiment of the invention. As shown in package 600, integrated circuit device 602 has been attached to topside 604 of coreless substrate strip 102. Integrated circuit device 602 may represent any type of silicon processor or controller or logic.

Figure 7:
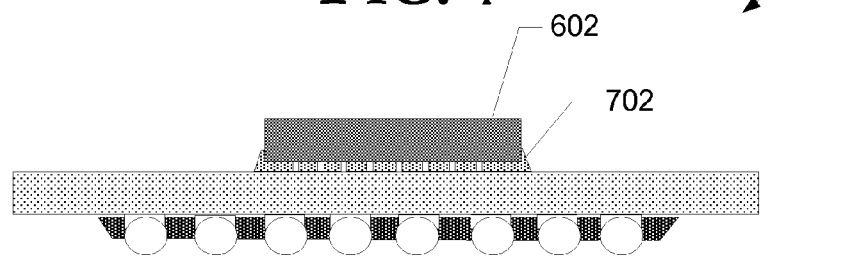
FIG. 7 is a graphical illustration of a cross-sectional view of a partially formed IC package, in accordance with one example embodiment of the invention.

FIG. 7 is a graphical illustration of a cross-sectional view of a partially formed IC package, in accordance with one example embodiment of the invention. As shown in package 700, underfill material 702 has been dispensed under integrated circuit device 602.

Figure 8:
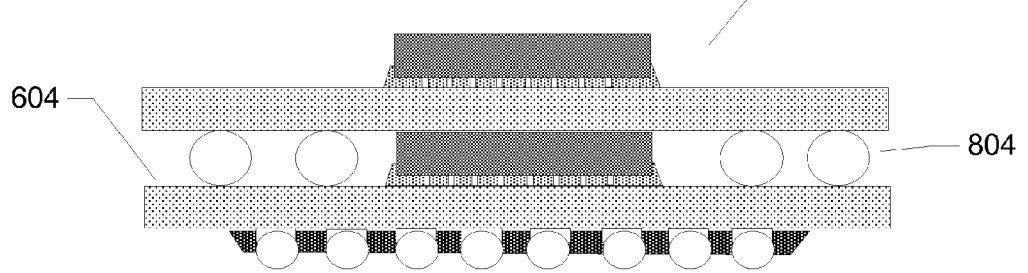
FIG. 8 is a graphical illustration of a cross-sectional view of a partially formed IC package, in accordance with one example embodiment of the invention.

FIG. 8 is a graphical illustration of a cross-sectional view of a partially formed IC package, in accordance with one example embodiment of the invention. As shown in package 800, second integrated circuit device package 802 has been attached to topside 604 through solder balls 804. Second integrated circuit device package 802 may be any type of package and need not be a flip chip package.

In one embodiment, package 800 is processed further and singulated from other packages.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
a coreless substrate strip;
a plurality of solder balls attached to a backside of the coreless substrate strip; and
a backside stiffening mold amongst the solder balls, the backside stiffening mold being compressed to a level below a height of the plurality of solder balls and cured.

2. The apparatus of claim 1, wherein the backside stiffening mold comprises a height of about 200 micrometers.

3. The apparatus of claim 1, wherein the coreless substrate strip comprises a height of about 200 micrometers.

4. The apparatus of claim 3, further comprising an integrated circuit device attached to a topside of the coreless substrate strip.

5. An apparatus comprising:
a laser laminated substrate strip;
a plurality of solder balls attached to a backside of the laser laminated substrate strip;
a backside stiffening mold amongst the solder balls, the backside stiffening mold being compressed to a level below a height of the plurality of solder balls and cured; and
an integrated circuit device attached to a topside of the laser laminated substrate strip.

6. The apparatus of claim 5, wherein the backside stiffening mold comprises a height of about 200 micrometers.

7. The apparatus of claim 5, wherein the laser laminated substrate strip comprises a height of about 200 micrometers.

8. The apparatus of claim 5, wherein the solder balls comprise a diameter of about 10 mils.

9. The apparatus of claim 5, further comprising a second integrated circuit device package attached to the topside of the laser laminated substrate strip.

10. An apparatus comprising:
a coreless substrate strip, including topside contacts adapted for attachment to an integrated circuit device, and backside contacts formed at a pitch larger than the topside contacts;
a plurality of solder balls attached to a backside of the coreless substrate strip; and
a backside stiffening mold amongst the solder balls, the backside stiffening mold being compressed to a level below a height of the plurality of solder balls and cured.

11. The apparatus of claim 10, further comprising an integrated circuit device attached to the topside contacts.

12. The apparatus of claim 11, further comprising a second substrate attached above the coreless substrate strip.

13. The apparatus of claim 12, wherein the second substrate includes a coreless substrate strip.

14. The apparatus of claim 12, further comprising a second integrated circuit device attached to a top surface of the second substrate.

15. An apparatus comprising:
a laser laminated substrate strip, including topside contacts adapted for attachment to an integrated circuit device, and backside contacts formed at a pitch larger than the topside contacts;
a plurality of solder balls attached to a backside of the laser laminated substrate strip;
a backside stiffening mold amongst the solder balls, the backside stiffening mold being compressed to a level below a height of the plurality of solder balls and cured; and
an integrated circuit device attached to a topside of the laser laminated substrate strip.

16. The apparatus of claim 15, wherein the backside stiffening mold comprises a height of about 200 micrometers.

17. The apparatus of claim 15, wherein the laser laminated substrate strip comprises a height of about 200 micrometers.

18. The apparatus of claim 15, wherein the solder balls comprise a diameter of about 10 mils.

\* \* \* \* \*